United States Patent [19]

Goldberg

[11] Patent Number: 4,829,565
[45] Date of Patent: May 9, 1989

[54] TELEPHONE WITH BACKGROUND VOLUME CONTROL

[76] Inventor: Robert M. Goldberg, 120 Orleans La., Jericho, N.Y. 11753

[21] Appl. No.: 110,667

[22] Filed: Oct. 20, 1987

[51] Int. Cl.$^4$ .............................................. H04M 9/08
[52] U.S. Cl. ..................................... 379/390; 381/107
[58] Field of Search ............... 379/387, 388, 389, 390, 379/395; 381/94, 104, 107, 108

[56] References Cited

U.S. PATENT DOCUMENTS

| | | | |
|---|---|---|---|
| 3,963,898 | 6/1976 | Randmere et al. | 379/390 |
| 4,254,303 | 3/1981 | Takizawa | 381/107 |
| 4,628,526 | 12/1986 | Germer | 381/94 X |
| 4,715,063 | 12/1987 | Haddad et al. | 379/390 |

OTHER PUBLICATIONS

"Automatic Voice Volume Control Circuit", Japan Institute of Invention and Innovation, vol. 8-18, May 20, 1983 (in Japanese).
"Effect of Noise on Listening Levels in Conference Telephony", Mark B. Gardner, J. of the Acoustical Society, vol. 34, No. 12, pp. 2354-2355.
"Beskrivning 1551-325, Automatisk Nivakontroll ANK 593 298/1, Mikrofonforstarkare 593 296/1", L. M. Ericsson, Nov. 2, 1979 (in Swedish).
"Vorschlag fur eine neuartige automatische Pegelsteuerung fur raumakustiche Aufgaben", Ulrich Fusban, Nachrichten Elektronik, Feb. 1978, p. 51.
"Electro-Acoustical Equipment for the Trains and Stations of the Munich Underground", Reinhard Bauersachs and Hans Gerland, Siemens Review, vol. 41, No. 12, 1974, pp. 567-569.

Flyer from JBL, Inc. for Model 7124B AGC Amplifier.
Flyer from UREI, Inc., P.O. Box 2200, 8500 Balboa Boulevard, Northridge, Calif. 91329, for Model 950 ANCA Ambient Noise Controlled Amplifier.
Flyer from ALTEC Sound Products Division for Model 1605B Noise-Operated Automatic Level Adjustment Device.

*Primary Examiner*—Steven Mottola

[57] ABSTRACT

This invention relates to the adjustment of sound intensity (volume) from appliances which communicate audible information to users. Information carried by sound energy from an appliance competes with whatever audible noise is present in the listener's area. Some appliances have volume controls that let the user adjust sound intensity. These controls do not deal adequately with background noise that changes often, and which makes it necessary for the user to frequently reset the volume control. A setting of volume control that is appropriate at a quiet time, may make it impossible to understand a message when background noise becomes louder. Similarly, a volume control setting which is suitable when background noise is high may produce a message which is disturbingly loud when background noise is low.

The present invention solves this problem of audio volume control by monitoring background noise in the listening area and automatically adjusting the sound level of the appliance accordingly. By raising the volume of sound in the presence of higher background noise, and lowering the volume of sound when background noise level is lower, the needs of the user are better met.

10 Claims, 4 Drawing Sheets

Figure 2 a) Location of Noise Sensor b) Loudness of the Incoming Call Signal After Each "Ring"

TELEPHONE WITH BACKGROUND VOLUME CONTROL

BACKGROUND OF THE INVENTION

1. Field of the Invention

This invention relates to electrical and electronic appliances and other equipment which accept and produce audible output in order to communicate information to users. The disclosure applies to such appliances and equipment, whether the sound produced is speech, music, alarm, signal, or any other information that the ear can hear and the mind appreciate. In particular, the invention relates to control of the loudness of: (a) received voice, and (b) the incoming call signal, in telephonic instruments.

2. Description of the Prior Art

Appliances and equipment which produce audible output often have means (called volume controls) by which a user can adjust the level of sound intensity (MVC, for short). Where audible output level is likely to fluctuate widely over time due to a varying input signal, or as a result of variations within the appliance itself (including power mains effects), an automatic sound level or volume control (AVC, for short) is conventionally used. AVC, through the mechanism of inverse feedback, results in a reduction in the range of output signal fluctuation relative to a wider range of input signal fluctuation or other variations due to changes in the appliance itself (including power mains effects).

The ability of a listener to hear and appreciate audible sound produced by an appliance or other equipment is dependent on the intensity of such sound in comparison to that of background audible noise present in the listening area. A familiar problem, in many situations where appliances and other equipment that produce audible sound are used, is interference from ambient audible noise that varies with time. An MVC setting that is suitable under quiet conditions may produce too low a level of output when background noise increases. Conversely, the MVC setting used when loud background noise is present may cause a disturbingly loud output when quiet backgound conditions exist. Two familiar cases of this shortcoming in existing telephonic instruments are noted here:

The first case involves a telephone user attempting to carry on a conversation in a room in which the background noise level varies. Most electronic phones have line length compensation circuits (AVC) that maintain average signal level constant independent of the subscriber's distance to the central office; these circuits do not solve the problem of fluctuating, audible background noise. Some telephones provide MVC. If the phone is equipped with MVC, then a user attempting to hear a message in the presence of varying background noise, may find it necessary to frequently divert attention from the conversation in order to reset the control.

The second case involves incoming telephone call signals which may not be heard in a noisy room. Older, electromechanical phones are equipped with a "clapper" bell that often have a mechanical lever to set the loudness level of the incoming call signal. Electronic phones employ an audio transducer, which may also have an adjustment for loudness. When phones with a loudness adjustment for the incoming call signal are used in areas where there is varying background noise level, a setting that is suitable under quiet conditions, may be inadequate when loud noise is present. Conversely, the adjustment, that is suitable when loud noise is present, will, in a quiet room or at night, be unnecessarily disturbing.

For those wishing information about prior art in these areas, reference is made to one of the standard textbooks or handbooks on the subject. Recommended are J. Atkinson TELEPHONY (London vols. 1 and 2, 1968, Pitman and Sons Ltd.); "The Electronic Telephone", Peter P. Luff, SCIENTIFIC AMERICAN, March 1978, pages 58-64; AND ELECTRONIC CIRCUITS, D. L. Schilling and C. Belove, (McGraw-Hill, New York, 1979).

SUMMARY OF THE INVENTION

The present invention is an improvement and an addition to many electrical and electronic appliances and other equipment which use audible output as a means to communicate information to users.

Audible output from appliances and equipment must compete with background noise present in the listening area. The intensity level of such noise often varies with time. Some appliances and equipment provide a manual volume control (MVC) that permits the user to adjust the level of sound produced. Under changing background noise conditions, there may be a need to frequently readjust the MVC to suit the immediate background noise level.

Some appliances provide automatic volume control (AVC) in order to maintain sound volume at a relatively constant level in spite of wide changes in the input signal level, or level changes caused by the appliance itself. Equipment with the AVC feature does not deal with the problem of varying background noise; this presently requires user adjustment (if such means are provided).

An object of the present invention is to provide an automatic adjustment of sound intensity based on a measurement of audible background noise. The concept behind the present invention will be referred to as background volume control (or BVC). In appliances or equipment which incorporate BVC, the volume of sound is automatically raised when the level of background noise becomes higher, and the volume of sound is automatically lowered when the level of background noise becomes lower. In this manner, the appliance or equipment better meets the needs of the listener.

A difficulty with disclosed efforts to provide BVC has often been an inability to monitor noise independently of the sound produced by the appliance. An object of the present invention is to provide means by which background noise is measured without significant contribution from the output of the appliance.

An object of the present invention is to eliminate the need for a user to frequently readjust the MVC setting in order to hear audio output at a satisfactory level relative to background noise.

An object of the present invention is to prevent the loss of information that results when an MVC setting is too low and background noise masks the output sound.

An object of the present invention is to limit the volume of audible signals from electronic appliances and equipment to a level that is sufficient to gain the listener's attention, but not to be disturbing.

An object of the present invention is to provide BVC in many appliances and equipment that have not previously had MVC.

An object of the present invention is to provide BVC for appliances and equipment that can be overridden by MVC at the user's option.

An object of the present invention is to provide BVC for appliances and equipment that works in conjunction with MVC.

DESCRIPTION OF THE PREFERRED EMBODIMENT

For the purposes of the description and the claims of this disclosure, the following two definitions are made:

AUDIO APPLIANCE will be taken to mean any electrical or electronic appliance, device, machine, equipment, etc. that provides audible output as a means to convey information to a user. This includes those that: accept and convert sound directly, receive a sound modulated carrier, playback sound from recording media, generate sound analytically, etc.

BACKGROUND NOISE will be taken to be any sound in the listening area of an AUDIO APPLIANCE, other than that produced by the appliance, which may interfere with the ability of the user to hear or appreciate the sound produced by the AUDIO APPLIANCE.

Figure 1:
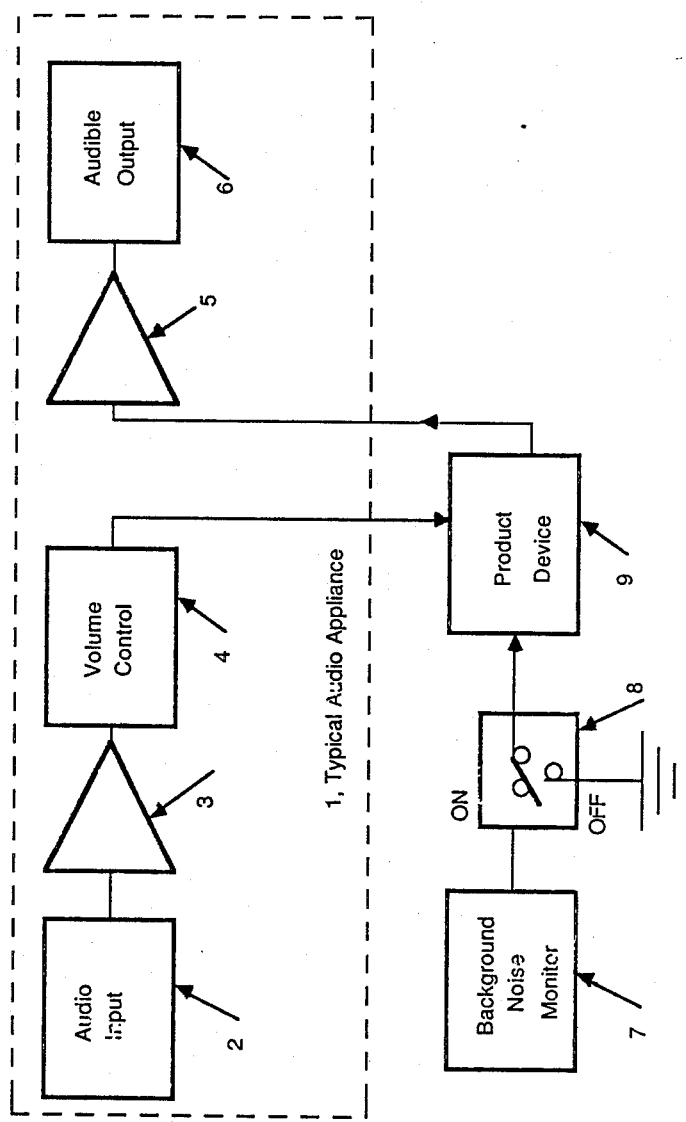
FIG. 1 is a block diagram representation of the elements of a typical audio appliance to which BVC is applied.

This invention consists of additions and modifications to audio appliances in order to control their output volume based on a measurement of background noise in the listening area. The system upon which this invention is based will be referred to as background volume control or BVC. FIG. 1 illustrates a general application of BVC to a typical appliance.

Item 1 is a composite block containing blocks 2, 3, 4, 5 and 6, which together make up the relevant elements of a typical AUDIO APPLIANCE. This invention adds the background noise monitor, 7, and a product device (such as a voltage-controlled amplifier or attenuator), 9, to the typical appliance, which together exercise control over the volume of sound produced. Single-pole, double-throw switch, 8, allows the user to disable the BVC, and have conventional volume control determine the sound level produced.

The audio input from block 2, may be produced by:
a sound transducer (microphone, etc.);
a receiver and detector of an electromagnetic carrier (radio, optical, etc.) through space or through media (wire, fibre optic cable, etc.);
play-back from a storage medium (magnetic tape, phonograph recording, etc.);
a sound simulator (computer, state machine, etc.);
the logic of any other appliance that produces audio output in order to communicate information.

The audio amplifier, 3, raises the level of, and perhaps filters, emphasizes, conditions, etc., the audio input signal in order to enhance signal-to-noise ratio, or match characteristics of the transducer, etc., depending upon the nature of the input signal.

The volume control, 4, may be manually adjusted (MVC), automatic (AVC), or fixed level. The signal at this point in a typical audio appliance without BVC would be directly applied to the output amplifier, 5. For BVC, the audio signal is shown diverted to a product device, 9. The product device weights the signal reaching amplifier 5, in accordance with the amount of background noise measured by monitor 7. Block 9 is a voltage-controlled, continuous- or programmable-gain or -attenuation device, that allows the BVC to automatically control output sound level. This control may encompass the full range of power available from amplifier 5, or be limited to only some portion. The control characteristic may be linear, non-linear, or "delayed" as is known and applied to AVC circuits. The type of appliance and its output message, as well as the expected ambient noise conditions are among factors to be considered in selecting among these design characteristics.

In the BVC mode, the output transducer, 6, driven by amplifier 5, at a level determined by monitor 7 and control 9, produces the audible output sound. The output transducer in 6 may be electromagnetic, electromechanical, piezoelectric, magnetostrictive, or any other electroacoustic device, including: loud speaker, ear phone, bell, buzzer, chime, etc. The sound produced by transducer 6 may be voice, music, signals, etc., which competes for the user's attention with any BACKGROUND NOISE that may be present.

The background noise monitor, 7, has a sound transducer that ideally is completely isolated from the output sound produced by the appliance. The monitor produces a measure of background noise on either a real- or discrete-time basis and applies this to control 9. BVC selection switch, 8, allows the user to apply BVC; to disable BVC, and have conventional volume control for the appliance. The isolation of the BACKGROUND NOISE measurement can be achieved by different means dependent on the particular appliance, and the expected listening conditions. Time-, frequency-, space-, code-division multiplex, or other effective signal processing technique may be applied individually or in combination to achieve a separate measure of the background noise in the listening area.

This invention deals with the application of BVC to control the loudness of (a) received voice, and (b) the incoming call audible signal in telephonic instruments. Different techniques are used, in each of these two cases, to separate the sound produced by the subset, as well as by the user's voice into the mouthpiece, from the measurement of background noise.

Time separation alone is sufficient to isolate the measurement of noise in a telephone instrument that only uses BVC for the control of incoming call signal loudness. When the handset is "on-hook", the output of the mouthpiece transducer can be switched to the input of the noise monitor. When the handset is taken "off-hook", the mouthpiece can be switched to its normal position for interface to the telephone line. In addition, during times that the audible incoming call signal ("ring") is being produced, the noise measuring circuit can be disabled. Alternatively, a separate transducer could be used to convert the audible background noise to an electrical measure.

Telephone instruments typically have a "hook" switch, which changes their function from a "wait" status to a "call" status. The transition is usually made when the user takes a handset from its cradle/holder, and changes the state of the "hook" from "on" to "off". In the "on-hook" condition, an incoming call detector is switched across the telephone line and is available to signal the user when an incoming call signal is applied at the telephone company central office. In the "off-hook" condition, line terminating audio communication circuits are placed across the telephone line and permit the user to communicate with audible sound. More recent telephonic instruments have introduced other means for signaling when an incoming call is present, and for changing the instrument's status. The description here retains conventional "hook" terminology.

Figure 4:
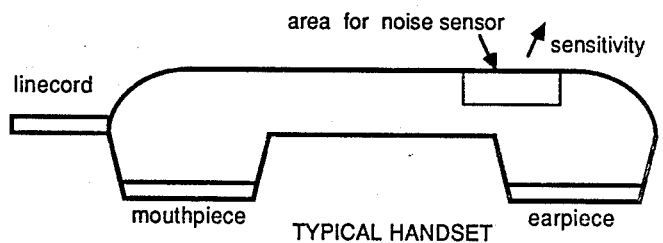
FIG. 4(a) shows the isolated location on the telephone handset of the transducer for measuring background noise.
FIG. 4(b) shows the programmed loudness characteristic for the INCOMING CALL SIGNAL that is developed by the system in FIG. 2.
Figure 4:
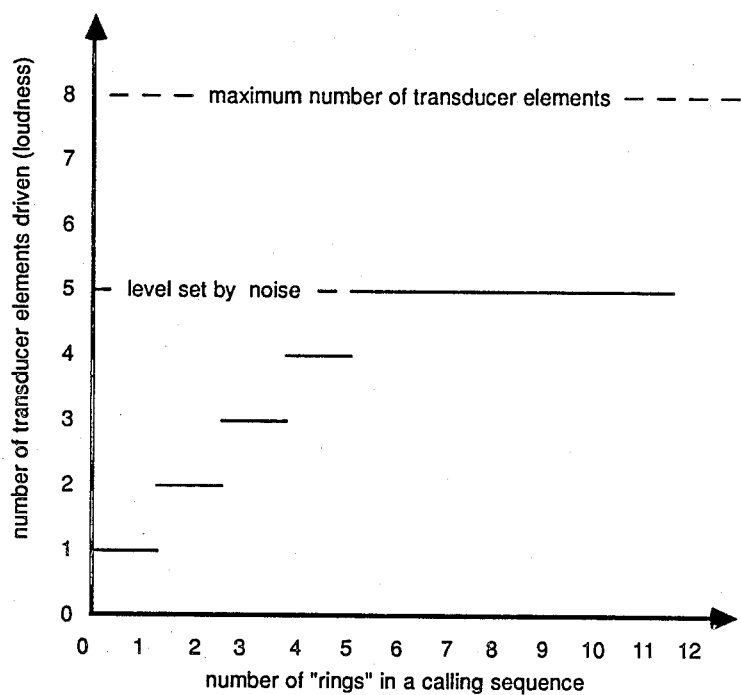

For telephone instruments that use BVC to control the loudness of the received voice signal a separate noise measuring transducer is required. This transducer might also be used for the control of incoming call signal loudness, in which case, it functions both "on- and off-hook". Consequently, time separation alone is not sufficient to isolate the measurement of background noise from sound produced by the instrument, as well as the user's voice. Some isolation can be achieved by the location, directivity, and insulation of the noise measuring transducer. FIG. 4(a) shows the general location on a handset to achieve some isolation. (Obviously, the particular configuration (wall, table, speaker-phone, mobile, etc.) of the telephone instrument affects this matter.) In addition, the output of the noise monitor can be cross-correlated against the received voice and user's voice, and the noise measurement weighted accordingly. The instrument illustrated in FIG. 2 and the description below are for the case of controlling the loudness of both received voice and incoming call signals. The case of telephone instruments that use BVC to control only one of these functions is simpler and follows directly from the description below.

Figure 2:
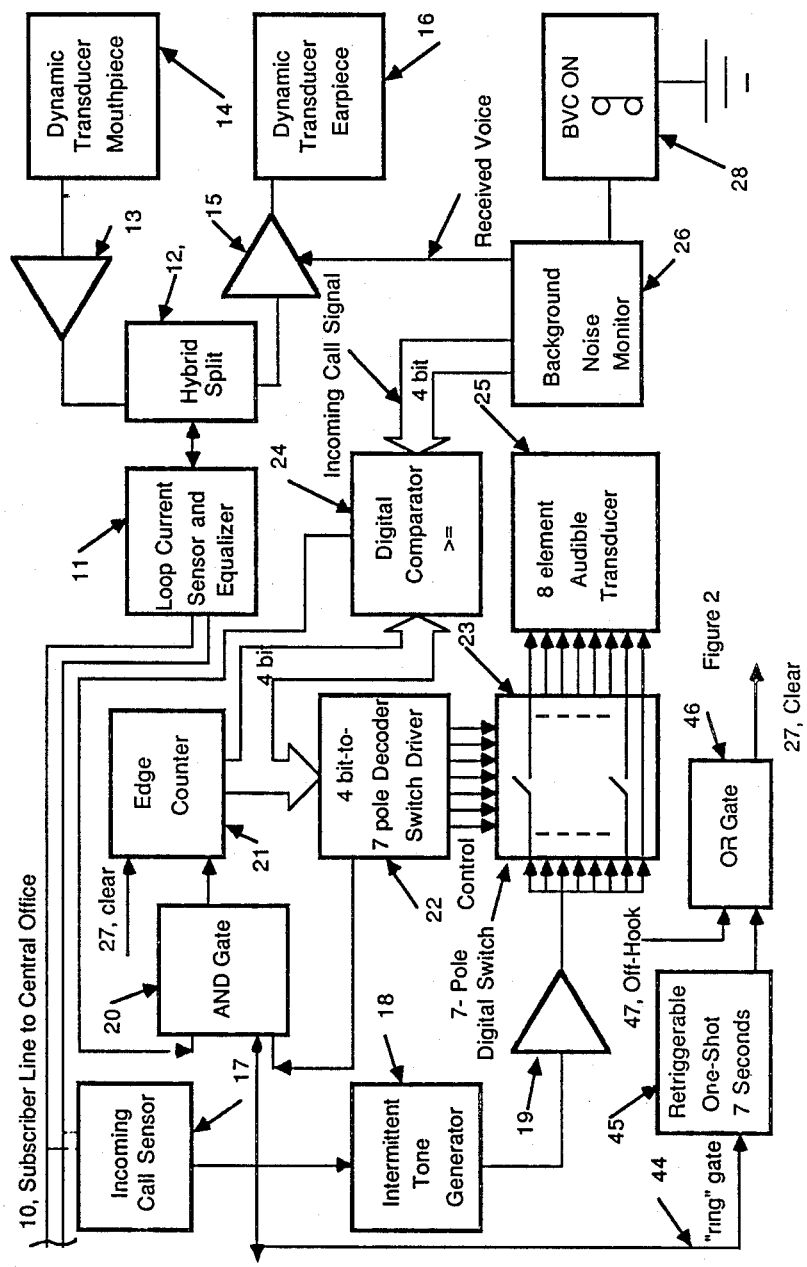
FIG. 2 is a block diagram representation of the relevant elements of an electronic telephone subset (instrument) that applies this invention to the adjustment of the INCOMING CALL SIGNAL volume, as well as to the volume of RECEIVED VOICE.

FIG. 2 is a block diagram of an electronic telephone subset with BVC applied to control the volume of: (a) the received voice signal, and (b) the incoming call signal. The control functions shown here are implemented with random electronic logic elements, both to illustrate functional roles more clearly and as one means of implementation. Microprocessor or other integrated circuit components should be employed as they are more economical for quantitiy production.

The subscriber line twisted pair, 10, (in FIG. 2) connects the subscriber's telephone instrument to the telephone company central office (alternatively, the connection link might be by radio, etc.). The additions/modifications to the electronic telephone for the purpose of applying BVC are 15, 17, and 19 through 47.

The sound transducer, 14, converts the subscriber's voice energy, directed at the mouthpiece of the subset, into an equivalent electrical signal. Audio amplifier, 13, raises this signal to a level that is suitable to modulate the corresponding phone line current.

The sound transducer, 16, produces sound energy in the telephone's earpiece corresponding to the received phone line voice current. Audio, controlled-voltage amplifier, 15, raises the level of the incoming voice signal in accordance with the analog control signal from the background noise monitor, 26. In addition, amplifier 15 is used with the equalizer circuit, 11, (connection not shown) as described below.

The line-length equalizer circuit, 11, places a resistive load across the telephone line and monitors the loop current established by the central office battery circuit when the subscriber's telephone instrument is "off-hook". Based on the magnitude of this current, equalizer 11 and amplifier 15 (connection not shown) adjust the level of audio signal in the earpiece to compensate for line loss differences due to varying distances between the subscriber's instrument and the telephone company central office.

The hybrid splitter/combiner, 12, separates incoming and outgoing voice signals and maintains a fixed amount of sidetone between mouthpiece and earpiece.

The incoming call detector, 17, is connected across the phone line. The detector senses the presence of either the traditional twenty Hertz "ringing" voltage, a digital tone code, or other signal that may be used (in non-standard networks) to indicate at the subscriber's instrument that an incoming call requires attention. When the call sensor circuit detects an incoming call, it turns on the intermittent tone generator, 18, which produces an audio tone ("ringing") for a specified period (two seconds on, four seconds off). Also, generated by detector 17 for each "ring", is a short pulse that is applied to AND gate, 20.

Generator 18 is applied to one or more of the eight discrete piezoelectric transduction elements that form the incoming call signal array, 25. The tone voltage is applied through the array of seven voltage-actuated digital switches, 23. (One transduction element of 25 is always directly connected to generator 18.) The loudness of the elements is not necessarily the same. The switch poles of 23 are controlled by the digital voltages on the seven discrete lines that are output from the digital decoder and switch driver, 22. The state of these seven lines, in turn, is a function of the four digitally-encoded outputs of the digital counter, 21. As counter 21 accumulates the count of "rings" during an incoming call sequence, the number of transducers driven by the tone voltage, and thus, the loudness of the incoming call signal, increases correspondingly. The digital decoding circuitry of 22 contains the program for this change in loudness. A typical characteristic, with an increase to a maximum of five elements as determined by the measured noise, is shown in FIG. 4(b).

The clock signal, 44, (for counter 21), comes through the AND gate, 20, from detector 17. This arrangement counts and holds the number of "rings" in a calling sequence, to a maximum, until the counter is cleared by signal 27. Clear signal 27 is formed by the OR gate, 46, and occurs either when the telephone instrument is "off-hook" or when the retriggerable one shot, 45, does not receive a retriggering pulse for at least seven seconds. That is, if there is no incoming call or the calling sequence has ceased. The OFF-HOOK signal is derived from a switch keyed to the condition of the handset of the telephone instrument. The "ring" pulses will pass through gate 20 until being inhibited by: either the output signal of the digital comparator, 24, or an output from the decoder, 22. The decoder output asserts when counter 21 has reached its maximum count of fifteen. Comparator 24 compares the magnitude of digital numbers from counter 21 and the four bit digital number from the background noise monitor. If the count in counter 21 is less than or equal to the number produced by the background noise monitor, the count of the number of "rings" in 21 will increase with each "ring". When the count in 21 reaches that of the background noise measure, the count will be held. The count in 21 is also applied to the decoder/switch driver, 22, which turns on additional transducer elements as the count increases. In this way the loudness of the incoming call signal according to the program in FIG. 4(b) with each "ring", to a maximum determined by the background noise that is present, or the maximum number of elements, eight.

The background noise monitor, 26, (more fully described in FIG. 3, below) provides an analog signal, (a), that controls the received voice signal gain, and a four bit digital signal, (b) that controls the maximum loudness of the incoming call signal. The BVC may be turned OFF with the BVC selection switch, 28. Switch 28 disables the BVC by placing constant, mid-range signals on lines (a) and (b).

Figure 3:
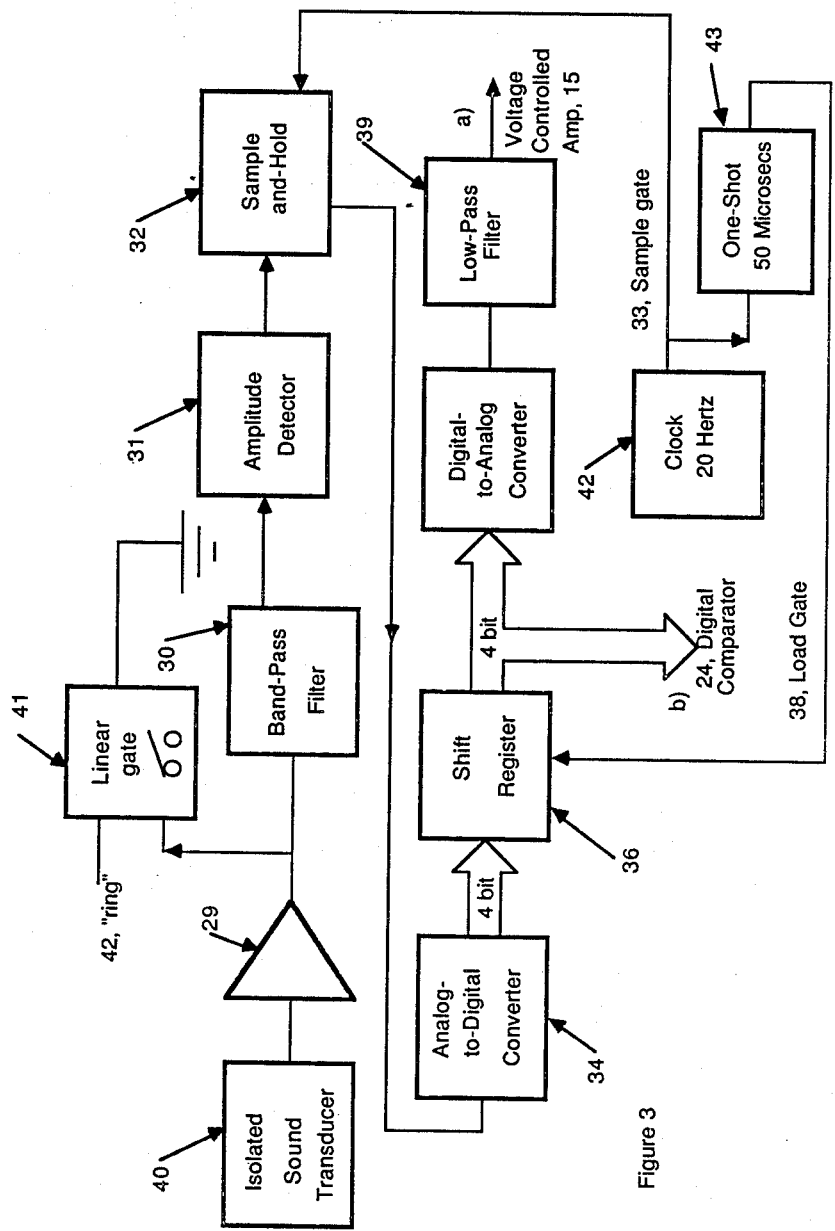
FIG. 3 is a more detailed block diagram representation of the elements of the background noise monitor used in FIG. 2 to generate the control signals for adjusting sound volume of: (a) RECEIVED VOICE, and (b) the INCOMING CALL SIGNAL.

FIG. 3 illustrates the circuit of the background noise monitor. As shown there, four bit digital signals are used to control the loudness of the incoming call signal and an analog signal controls the loudness of the received voice signal. Alternatively, other equivalent arrangements might be more practical, depending on the physical configuration and particular components of a given telephone's design.

The noise measuring sound transducer, 40 is acoustically-insulated and directionally-isolated from most of the sound of the user's voice and from the sound produced by the earpiece of the telephone. There is also time isolation between the noise measurement and the sound of the incoming call signal. The noise measurement is interrupted by transmission gate, 41, during the time the incoming call signal is audible (ringing). Additional separation is possible with time-gating or signal subtraction methods (not illustrated here).

The signal from the transducer, or from the additional separation means which follow the transducer, which measures background noise is applied to the audio amplifier, 29, band-pass filter, 30, and amplitude detector, 31. This chain of signal processing produces a fluctuating direct current proportional to the intensity of the background noise present.

The sample-and-hold circuit, 32, takes the measure of background noise and converts it to a steady voltage between time periods determined by the pulsed sampling gate, 33. Gate 33 is generated by the timing circuit, 42, and has a repetition rate of about fifty times a second.

The four bit analog-to-digital converter, 34, takes the held voltage and converts it to a number that is latched into the four bit, parallel shift register, 36. The register load gate, 38, operates at the same rate as the sample gate, but is delayed by 50 microseconds by the one-shot multivibrator, 43, in order to give the output of the converter time to settle. The load gate 38 is not active when the user is talking. A threshold sensing circuit (not shown) at the output of dynamic transducer 14, generates a gate that turns-off the load gate when the user is talking. (Extremely loud background noise could do the same; during such times use of the phone is not possible).

The output of register 36, (b), is applied to comparator 24 and determines the maximum number of transducer elements that can be turned-on (and consequently the loudness of the audible signal). Register 36 is also connected to digital-to-analog converter, 37. The converter's output is a continuous measure of the background noise present. It is applied to the low-pass filter, 39, and is the analog voltage used to adjust the gain of amplifier 15.

I claim:

1. I claim an electronic system comprised of, an AUDIO APPLIANCE for producing sound output information within a listening area, means to monitor BACKGROUND NOISE level in the listening area independently of the sound produced by the appliance, and means to electrically vary the output from the appliance which, when these elements are connected together and placed in a location relative to a listener, adjust the sound level of the output produced by the appliance, in accordance with the measured noise level that is present in the area, and the need of the listener for a louder audible output from the appliance when noise level is high, and a lower audible output from the appliance when noise level is low, for electronic telephonic instruments comprised of:
   (a) a subset switch that determines "on-" and "off-hook" conditions of a telephone subset,
   (b) an incoming call signal detector, signal generator, and so transducer,
   (c) audio line termination elements, an electrical hybrid, and a sound transducer in an earpiece of the subset,
which, respectively, convert the instrument from "on-hook" incoming call status to "off-hook" audible communication status; signal the user that an incoming call is present; and receive, separate, and transduce voice signals into corresponding audible sound, and, which together comprise elements of telephonic instruments which produce audible output.

2. A unit as described in claim 1 further comprised of:
   (a) a voltage controlled amplifier
   (b) a background noise measuring circuit
which when these are suitably connected, the sound produced in the earpiece of the subset is dependent in a positive monotonic sense on the level of measured audible background noise in the user's area.

3. A unit as described in claim 1 further comprised of:
   (a) an array of independent voltage-to-sound transducing elements,
   (b) an array of digitally-controlled switches,
   (c) a digital decoding network,
   (d) a counter of incoming call occurences (rings),
   (e) a digital comparator,
   (f) a clear signal for the counter in (d),
which when these are suitably connected, produce an audible incoming call signal of progressively increasing loudness, to a maximum determined by the level of measured background noise, or the maximum number of transducer elements present.

4. A unit as described in claim 2 further comprised of:
   (a) an acoustically-insulated and directionally-oriented sound transducer,
   (b) an amplifier, a filter, an amplitude detector,
   (c) a sample-and-hold circuit,
   (d) an analog-to-digital converter,
   (e) a digital-to-analog converter and low-pass filter,
   (f) timing and logic gates, which when suitably connected together, form a circuit that measures background noise independently of the sound produced by the subset or user's voice, and provides an analog signal to control the loudness of received voice accordingly.

5. A unit as described in claim 3 further comprised of:
   (a) an acoustically-insulated and directionally-oriented sound transducer,
   (b) an amplifier, a filter, and an amplitude detector,
   (c) a sample-and-hold circuit,
   (d) an analog-to-digital converter,
   (f) timing and logic gates,
which when suitably connected together, form a circuit that measures background noise independently of the sound produced by the subset or user's voice, and provides a digital signal to be compared against the accumulated number of audible incoming call signals (rings), in a calling sequence, and to set the loudness of the audible incoming call signal accordingly.

6. A unit as described in claim 5 further comprised of:
   (a) a signal transmission gate,
   (b) a logical AND gate,
which when suitably connected to a digital signal which corresponds to the duration of the audible incoming call signal, causes an interruption in the input to the background noise measurement, and in this way removes the influence of sound produced by the subset.

7. A unit as described in claim 4 further comprised of:
   (a) a manually-operated switch, which when connected to the background noise measuring circuit allows a user to select BVC or normal volume control.

8. A unit as described in claim 6 further comprised of:
   (a) a manually-operated switch, which when connected to the background noise measuring circuit allows a user to select BVC or normal volume control.

9. A unit as described in claim 1 further comprised of:
   (a) a sound transducer with output that increases monotonically with the amplitude of drive voltage up to its maximum level.
   (b) a voltage controlled drive amplifier, and
   (c) a background noise measuring circuit that produces an output voltage that is monotonically dependent upon, and changes periodically with background noise,
which when these are suitably connected, will, during an incoming call sequence, produce an audible incoming call signal of progressively increasing loudness, to a maximum level determined by the level of measured background noise, or the maximum output level of the transducer.

10. A unit as described in claim 1 further comprised of:
   (a) a gain-progammable amplifier that drives the sound transducer in the earpiece, and
   (b) a background noise monitor with digitally encoded output,
which when suitably connected together, control the output sound level in a finite number of steps, as determined by the amount of background noise present, in a positive monotic sense.

* * * * *